(12) United States Patent
Ishii

(10) Patent No.: US 7,332,941 B2
(45) Date of Patent: Feb. 19, 2008

(54) ANALOG SWITCH CIRCUIT AND SAMPLE-AND-HOLD CIRCUIT INCLUDING THE SAME

(75) Inventor: Hirotomo Ishii, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/088,557

(22) Filed: Mar. 14, 2005

(65) Prior Publication Data

US 2005/0219102 A1    Oct. 6, 2005

(30) Foreign Application Priority Data

Mar. 16, 2004    (JP) ............................. 2004-074459

(51) Int. Cl.
*G11C 27/02* (2006.01)
(52) U.S. Cl. .......................... 327/96; 327/91
(58) Field of Classification Search ................. 327/91, 327/93–96
See application file for complete search history.

(56) References Cited

U.S. PATENT DOCUMENTS

| | | | |
|---|---|---|---|
| 6,040,732 A * | 3/2000 | Brokaw ...................... 327/408 |
| 6,359,496 B1 | 3/2002 | Steinhagen ................. 327/391 |
| 6,882,295 B2 * | 4/2005 | Leung ........................ 341/155 |
| 7,187,318 B1 * | 3/2007 | Lee et al. ................... 341/161 |
| 7,208,983 B2 * | 4/2007 | Imaizumi et al. ............. 327/94 |
| 2001/0026175 A1 * | 10/2001 | Ueno .......................... 327/94 |
| 2003/0197553 A1 * | 10/2003 | Itakura et al. ............... 327/554 |
| 2006/0087362 A1 * | 4/2006 | O'Halloran et al. ........ 327/427 |

FOREIGN PATENT DOCUMENTS

| | | |
|---|---|---|
| JP | 52-76867 | 12/1975 |
| JP | 64-71323 | 3/1989 |
| JP | H8-213909 | 8/1996 |
| JP | 2001-273786 | 10/2001 |

OTHER PUBLICATIONS

Razavi, B., "Design Of Analog CMOS Integrated Circuits," McGraw Hill, 2001, pp. 424-425.
Japanese Office Action dated Jan. 9, 2007 corresponding to the related Japanese Patent Application No. 2004-074459 (English and Japanese translations).

* cited by examiner

*Primary Examiner*—Kenneth B. Wells
*Assistant Examiner*—Ryan C. Jager
(74) *Attorney, Agent, or Firm*—DLA Piper US LLP

(57) ABSTRACT

First and second analog switches are connected in series between first and second nodes. One terminal of a third analog switch is connected to a series connection node of the first and second analog switches. The other terminal of the third analog switch is supplied with a second voltage different from a first voltage applied to the first node. The third analog switch drives on when the first and second analog switches drive off, and outputs the second voltage to the series connection node of the first and second analog switches.

19 Claims, 5 Drawing Sheets

ANALOG SWITCH CIRCUIT AND SAMPLE-AND-HOLD CIRCUIT INCLUDING THE SAME

CROSS-REFERENCE TO RELATED APPLICATIONS

This application is based upon and claims the benefit of priority from prior Japanese Patent Application No. 2004-074459, filed Mar. 16, 2004, the entire contents of which are incorporated herein by reference.

BACKGROUND OF THE INVENTION

1. Field of the Invention

The present invention relates to an analog switch circuit and a sample-and-hold circuit including the analog switch circuit.

2. Description of the Related Art

A sample-and-hold circuit has been widely used for Analog-to-Digital Converters (ADCs), etc. The sample-and-hold circuit is realized by combining analog switch circuits and capacitors. In order to improve conversion accuracy of the ADCs using the analog switch circuits, the following requirements are given. According to one requirement, a resistance value (on resistance) Ron when an analog switch turns on must be sufficiently small. According to another requirement, a resistance value (off resistance) Roff when the analog switch turns off must be sufficiently large, or the off leakage current Ioff must be sufficiently small.

The analog switch circuit is constituted by MOS transistors. The on resistance Ron and off resistance Roff of the MOS transistors are determined by the device dimensions of the MOS transistors that have been made by a specific process. More specifically, on resistance Ron is determined in accordance with the difference between gate-source voltage Vgs when the MOS transistor drives on and threshold voltage Vth. On the other hand, off resistance Roff is determined in accordance with the difference between the gate-source voltage Vgs when the MOS transistor drives off and the threshold voltage Vth.

Scale-down of devices included in a large-scale semiconductor integrated circuit (LSI) are advanced ones. The power supply voltage supplied to the analog switch circuit therefore drops. Hence, the gate-source voltage Vgs of the MOS transistor used as a switch device (element) also drops, too. As a result, the on resistance Ron increases. In this case, the threshold voltage Vth of the MOS transistor can be made low, whereby on resistance Ron is reduced. Nonetheless, the off resistance Roff decreases.

When the threshold voltage Vth of the MOS transistor is set to a predetermined value, the off resistance Roff depends on the gate-source voltage Vgs. The off leakage current Ioff is given by Ioff=Vds/Roff. In this case, Vds is a drain-source voltage. Thus, the off leakage current Ioff of the MOS transistor depends on each of gate voltage Vg, drain voltage Vd and source voltage Vs. In most cases, the gate voltage Vg for driving off the MOS transistor is at an "L" level (VSS) in the NMOS transistor and at an "H" level (VDD) in the PMOS transistor. As long as the NMOS transistor and the PMOS transistor remain off, the gate voltage Vg has a constant value in the NMOS and PMOS transistors. Therefore, the off leakage current Ioff of either MOS transistor depends on the drain voltage and the source voltage. Usually, the input signal is supplied as drain potential or source potential. An off leakage current that depends on the input-signal potential is generated in the MOS transistor of the analog switch circuit.

"Design of Analog CMOS integrated Circuits, Behzad Razavi, McGRAW-HILL, 2001, (page 425, FIG. 12.30)" discloses that a sample-and-hold circuit using an analog switch circuit and an operational amplifier. In general, when a leakage current is flowed in the analog switch circuit which is inserted between an inverting input terminal of the operational amplifier and an output terminal thereof, a value of the leakage current is dependent on a hold voltage of the sample-and-hold circuit. As a result, distortion occurs in the hold voltage.

JPN. PAT. APPLN. KOKAI Publication No. 8-213909 discloses that a potential difference between input and output of a switch device is set to zero. U.S. patent application Ser. No. 6,359,496 discloses the following technique. According to the technique, first and second switch circuits are connected in parallel in order to reduce the influence caused by the off leakage current of a switch device. The first switch circuit is composed of an NMOS transistor having a larger threshold voltage and a PMOS transistor, which are connected in parallel. The second switch circuit is composed of two NMOS transistors having a smaller threshold voltage and one PMOS transistor, which are connected in serial. In this case, transistors having two kinds of threshold voltages are required.

BRIEF SUMMARY OF THE INVENTION

According to a first aspect of the present invention, there is provided an analog switch circuit comprising:
a first node supplied with a first voltage;
a second node;
first and second analog switches connected in series between the first and second nodes, and controlled in on/off-sate; and
a voltage supply circuit connected to a third node which is a series connection node of the first and second analog switches, and supplied a second voltage different from the first voltage to the third node when both of the first and second analog switches are in off-state.

According to a second aspect of the present invention, there is provided a sample-and-hold circuit comprising:
a first node supplied with an input voltage;
an operational amplifier having an input terminal and an output terminal;
a first analog switch connected between the first node and a second node;
a capacitor connected between the second node and the input terminal of the operational amplifier;
a second analog switch connected between the output terminal of the operational amplifier and the second node;
third and fourth analog switches connected in series between the input and output terminals of the operational amplifier, and controlled in on/off-state; and
a voltage supply circuit connected to a third node which is a series connection node of the third and fourth analog switches, and supplied a second voltage different from a first voltage of the input terminal of the operational amplifier to the third node when both of the third and fourth analog switches are in off-state.

DETAILED DESCRIPTION OF THE INVENTION

Figure 1:
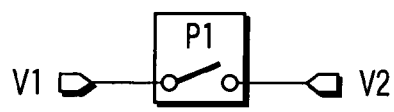
FIG. 1 is a view showing one example symbolizing an analog switch circuit.

FIG. 1 shows an example symbolizing an analog switch. According to the symbolization, the switch turns on when a control signal (clock signal) P1 is an "H" level; on the other hand, it turns off when the control signal P1 is an "L" level. When another signal is used in place of the control signal P1, the on/off-state of the switch is controlled in accordance with the "H" or "L" level of the signal. In FIG. 1, V1 and V2 denote input and output nodes of the switch, respectively.

Figure 2:
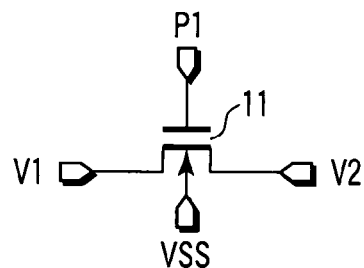
FIG. 2 is a circuit diagram showing the configuration of a first example of the analog switch circuit of FIG. 1.
Figure 3:
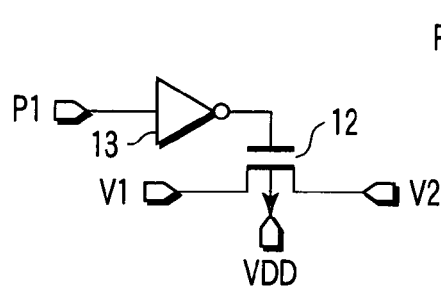
FIG. 3 is a circuit diagram showing the configuration of a second example of the analog switch circuit of FIG. 1.
Figure 4:
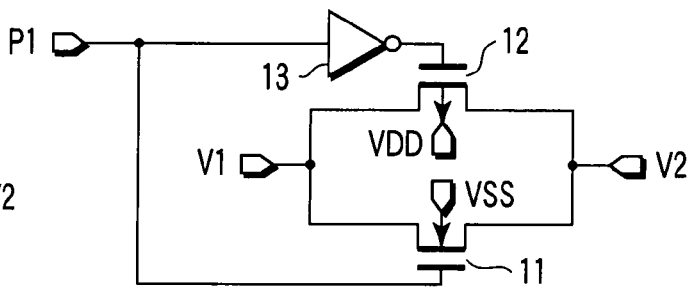
FIG. 4 is a circuit diagram showing the configuration of a third example of the analog switch circuit of FIG. 1.

FIG. 2, FIG. 3 and FIG. 4 show various circuit configuration examples of the analog switch of FIG. 1. The analog switch shown in FIG. 2 includes an NMOS transistor 11. The control signal P1 is supplied to a gate electrode of the NMOS transistor 11. The analog switch shown in FIG. 3 includes a PMOS transistor 12. An output signal of an inverter circuit 13 inputted with the control signal P1 is supplied to a gate electrode of the PMOS transistor 12. The analog switch shown in FIG. 4 includes NMOS transistor 11 and PMOS transistor 12, which are connected in parallel. The gate electrode of the NMOS transistor 11 is supplied with the control signal P1. On the other hand, the gate electrode of the PMOS transistor 12 is supplied with the output signal of the inverter circuit 13 inputted with the control signal P1. In FIGS. 1 to 4, VSS and VDD denote low and high power supply voltages supplied to the analog switch, respectively.

FIRST EMBODIMENT

Figure 5:
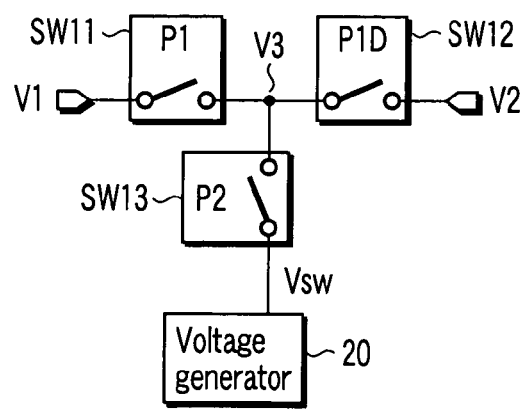
FIG. 5 is a block diagram showing the configuration of an analog switch circuit according to a first embodiment of the present invention.

FIG. 5 shows the configuration of an analog switch circuit according to a first embodiment of the present invention. The analog switch circuit includes first and second analog switches SW11, SW12, and third analog switch SW 13 used as a voltage supply circuit. The first and second analog switches SW11 and SW12 are connected in series between first and second nodes V1 and V2. One terminal of the third analog switch SW13 is connected to a series connection node of first and second analog switches SW11 and SW12, that is, third node V3. The third analog switch SW13 supplies a second voltage Vsw to the third node V3 when both first and second analog switches SW11 and SW12 turn off. The second voltage Vsw differs from a first voltage VIN supplied to the first node V1 in its value, and has a constant potential difference with respect to the first voltage VIN.

When the threshold voltage Vth of the MOS transistor is set to a predetermined value, the off resistance Roff depends on the gate-source voltage Vgs. The off leakage current Ioff is given by Ioff=Vds/Roff. In this case, Vds is a drain-source voltage. Thus, the off leakage current Ioff of the MOS transistor depends on each of gate voltage Vg, drain voltage Vd and source voltage Vs. In most cases, the gate voltage Vg for driving off the MOS transistor is at an "L" level (VSS) in the NMOS transistor and at an "H" level (VDD) in the PMOS transistor. As long as the NMOS transistor and the PMOS transistor remain off, the gate voltage Vg has a constant value in the NMOS and PMOS transistors. Therefore, the off leakage current Ioff of either MOS transistor depends on the drain voltage and the source voltage.

The analog switch circuit of FIG. 5 further includes a voltage generator circuit 20 for generating the second voltage Vsw. The second voltage Vsw generated by the voltage generator circuit 20 is supplied to the other terminal of the third analog switch SW13. The third analog switch SW13 outputs the second voltage Vsw to the third node V3 when the first and second analog switches SW11 and SW12 turn off. By doing so, the off leakage current occurring in the first analog switch SW 11 is kept at a constant value regardless of the value of the first voltage VIN.

The analog switches SW11 to SW13 may be configured like any of the analog switches described in FIG. 2, FIG. 3 or FIG. 4. More specifically, when the analog switches each includes the NMOS transistor 11 as described in FIG. 2, each substrate is supplied with VSS voltage while each gate electrode is supplied with the corresponding control signal (clock signal). When the analog switches each includes the PMOS transistor 12 as described in FIG. 3, each substrate is supplied with VDD voltage while each gate electrode is supplied with a signal in which the corresponding control signal is inverted by the inverter circuit 13. When the analog switches are each composed of NMOS transistor 11 and PMOS transistor 12 connected in parallel as described in FIG. 4, the substrate of the NMOS transistor 11 is supplied with VSS voltage while the gate electrode is supplied with the control signal. Likewise, the substrate of the PMOS transistor 12 is supplied with VDD voltage while the gate electrode thereof is supplied with a signal in which the corresponding control signal is inverted by the inverter circuit 13.

The analog switch circuit according to the first embodiment can comprises MOS transistors that have the same threshold voltage.

Figure 6:
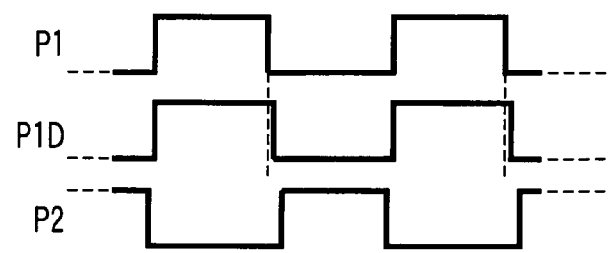
FIG. 6 is a waveform chart of control signals supplied to the analog switch circuit of FIG. 5.

FIG. 6 shows each waveform of control signals P1, P1D and P2 supplied to the analog switch circuit of FIG. 5. In this case, the control signal P1D is a signal delaying a fall of the control signal P1, that is, a signal, which becomes low level from high level after a delay of timing when the control signal P1 becomes low level from high level. The second analog switch SW12 is controlled according to the P1D so that it changes from on-state to off-state after a delay of timing when the first switch SW1 changes from on-state to off-state. By doing so, an influence caused by clock feed-through to the first node is reduced when the second analog switch SW12 changes from on-state to off-state.

(First Example of Analog Switch Circuit)

Figure 7:
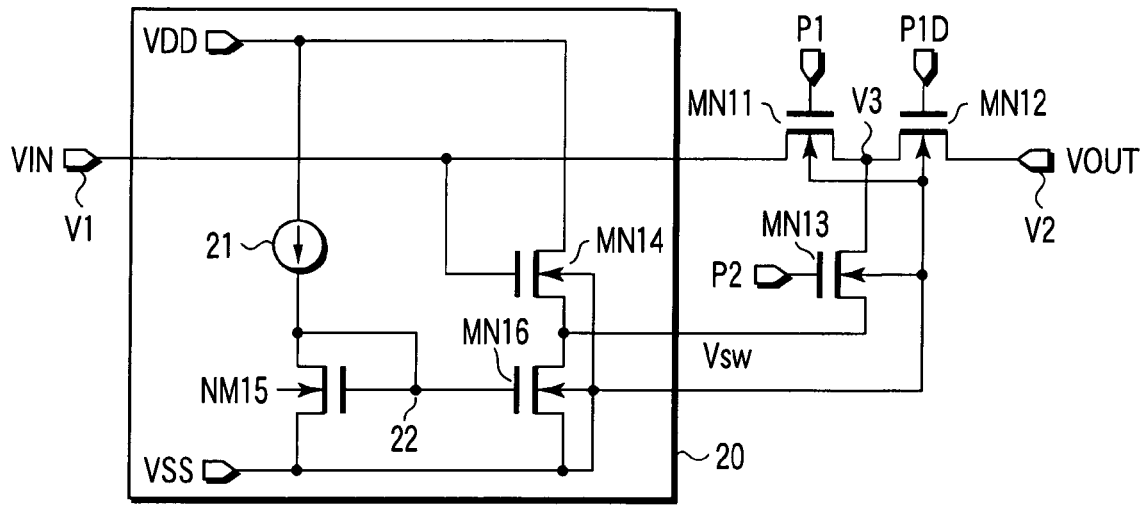
FIG. 7 is a circuit diagram showing a first example of the analog switch circuit of FIG. 5.

FIG. 7 shows a first example of the analog switch circuit of FIG. 5. The first to third analog switches SW11 to SW13 include NMOS transistors MN11 to MN13, respectively. A current path of the source-drain of the NMOS transistor MN11 is interposed between the first and third nodes V1 and V3. The gate electrode of the NMOS transistor MN11 is supplied with the control signal P1. A current path of the source-drain of the NMOS transistor MN12 is interposed between the third and second nodes V3 and V2. The gate electrode of the NMOS transistor MN12 is supplied with the control signal P1D. A current path of the source-drain of the NMOS transistor MN13 is interposed between the third node V3 and the output node of the voltage generator circuit 20. The gate electrode of the NMOS transistor MN13 is supplied with the control signal P2. In the foregoing NMOS transistors MN11 to MN13, their substrate is connected to a VSS node. In FIG. 7, VIN denotes a voltage of the first node V1, and VOUT denotes a voltage of the second node V2.

The NMOS transistor MN13 is controlled according to the control signal P2 so that it drives on when both NMOS transistors MN11 and MN12 drive off. The NMOS transistor MN13 outputs a second voltage Vsw to the third node V3. The second voltage Vsw differs from the first voltage VIN supplied to the first node V1 in its value, and has a constant potential difference with respect to the first voltage VIN. By doing so, the off leakage current of the NMOS transistor MN11 is kept at a constant value regardless of the value of the first voltage VIN.

The voltage generator circuit 20 for generating the second voltage Vsw includes current source 21, NMOS transistor MN14 and current mirror circuit 22. One terminal of the current source 21 is connected to a power supply voltage VDD node. One terminal of a current path of the source-drain of the NMOS transistor MN14 is connected to the power supply voltage VDD node. The gate electrode of the NMOS transistor MN14 is connected to the first node V1. The other terminal of the current path of the source-drain of the NMOS transistor MN14 is connected to a second voltage Vsw output node.

The current mirror circuit 22 includes two NMOS transistors MN15 and MN16. The current mirror circuit 22 supplies a current proportional to the current flowing through the current source 21 to the current path of the NMOS transistor MN14. A current path of the source-drain of the NMOS transistor MN15 is interposed between the other terminal of the current source 21 and a ground voltage VSS node. A current path of the source-drain of the NMOS transistor MN16 is interposed between the second voltage Vsw output node and the ground voltage VSS node. The gate electrodes of the NMOS transistors MN15 and MN16 are connected in common, and connected to the drain of the NMOS transistor MN15, that is, a connection node with the current source 21. The substrates of the NMOS transistor MN14 and MN16 are connected to the VSS node.

In the voltage generator circuit 20 having the foregoing configuration, when the first voltage VIN steps down, the output voltage, that is, the second voltage Vsw also steps down. Conversely, when the first voltage VIN steps up, the second voltage Vsw also steps up. Therefore, the potential difference (VIN - Vsw) between the first voltage VIN and the second voltage Vsw is controlled to keep a constant value.

If the threshold voltage Vth of the NMOS transistor MN11 is constant in the analog switch circuit of FIG. 7, the value of the off leakage current Ioff remains constant, provided that the gate-source voltage Vgs remains constant, too. However, in fact, the threshold voltage Vth varies resulting from an influence caused by the body effect of MOS transistors.

In order to keep the value of the off leakage current Ioff constant, the requirement given below must be satisfied. That is, the potential difference (VIN - Vsw) between the first voltage VIN and the second voltage Vsw is caused to coincide with a value in which variations of the threshold voltage Vth is added to a predetermined potential difference. In this example, when the NMOS transistor MN13 is driven on, the source voltage of the NMOS transistor MN11, that is, the voltage of the third voltage V3 becomes equal to the source voltage of the NMOS transistor MN14, that is, the second voltage Vsw. The threshold voltages Vth of the NMOS transistors MN11 and MN14 are equal to each other. A constant current proportional to the current of the current source 21 flows to the drain of the NMOS transistor MN14 via the current mirror circuit 22. Thus, the potential difference (VIN - Vsw) has a value including the variations of the threshold voltages Vth of the NMOS transistor MN11. Consequently, the off leakage current Ioff of the NMOS transistor MN11 is kept at a constant value.

(Second Example of Analog Switch Circuit)

Figure 8:
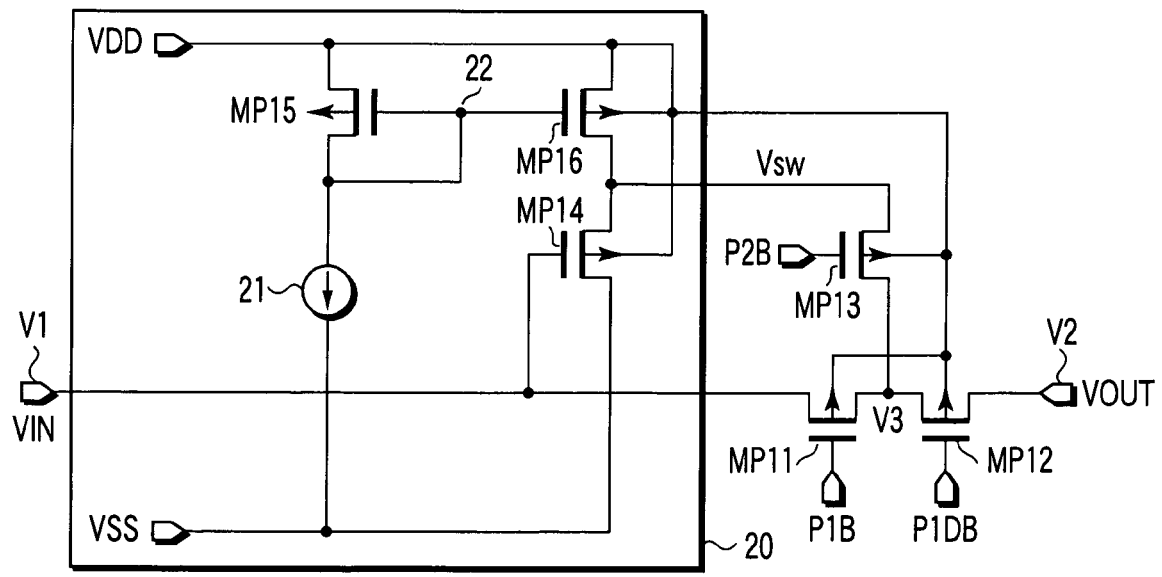
FIG. 8 is a circuit diagram showing a second example of the analog switch circuit of FIG. 5.

FIG. 8 shows a second example of the analog switch circuit of FIG. 5. An analog switch circuit of FIG. 8 differs from the analog switch circuit described in FIG. 7 in the following point. More specifically, all NMOS transistors are replaced with PMOS transistors, and the connection with respect to VDD and VSS nodes is made conversely to the case of FIG. 7. In FIG. 8, PMOS transistors MP11 to MP16 correspond to NMOS transistors MN11 to MN16, and control signals P1D, P1B and P2B are signals inverting control signals P1, P1D and P2 shown in FIG. 7.

The operation of the analog switch circuit of FIG. 8 is similar to the analog switch circuit of FIG. 7. Therefore, the off leakage current Ioff of the PMOS transistor MP11 is kept at a constant value regardless of the value of the first voltage VIN.

(First Application Example of Analog Switch Circuit)

Figure 9:
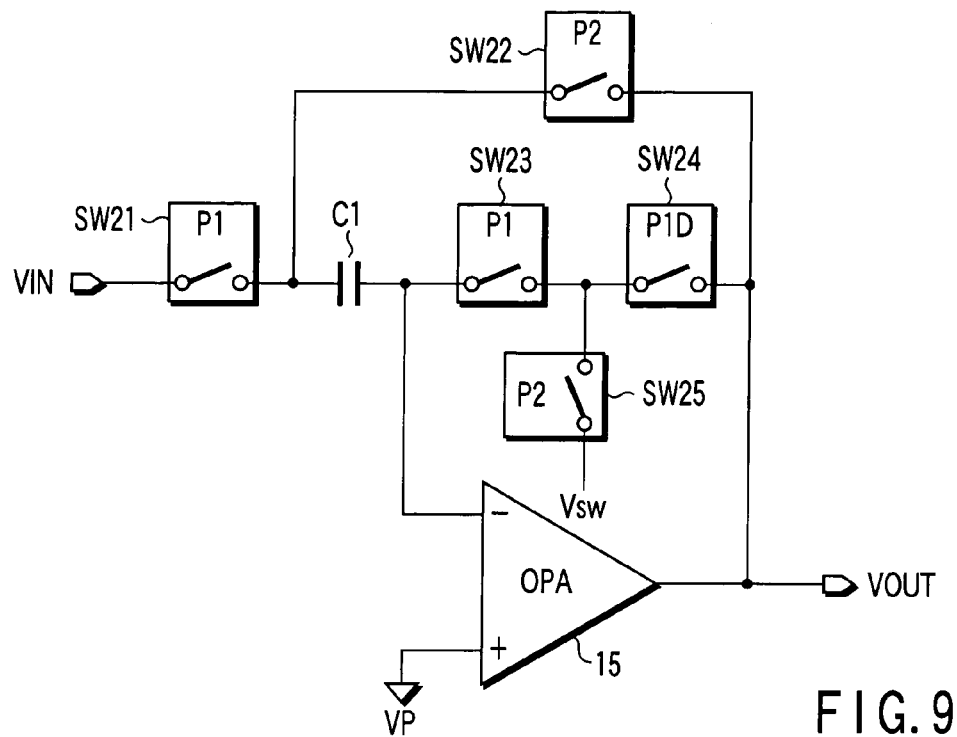
FIG. 9 is a circuit diagram showing a first example of a sample-and-hold circuit using the analog switch circuit of FIG. 5.

FIG. 9 shows the configuration of a sample-and-hold circuit using the analog switch circuit of FIG. 5. The sample-and-hold circuit includes analog switches SW21 to SW24, analog switch SW25 functioning as a voltage supply circuit, operational amplifier (OPA) 15 and capacitor C1. In FIG. 9, VIN denotes an input voltage of an input node, and VOUT denotes an output voltage of an output node.

The operational amplifier 15 has inverting input terminal (−), non-inverting input terminal (+) and output terminal. The analog switch SW21 and the capacitor C1 are connected in series between the voltage VIN input node and the inverting input terminal (−) of the operational amplifier 15. The analog switch SW 22 is connected between the output terminal of the operational amplifier 15 and a series connection node of the analog switch SW21 and the capacitor C1. The analog switches SW 23 and SW24 are connected between the output terminal of the operational amplifier 15 and the inverting input terminal (−) thereof. One terminal of the switch SW25 is connected to a series connection node of analog switches SW23 and SW24. The other terminal of the switch SW25 is supplied with a voltage Vsw.

The analog switches SW21 and SW23 are controlled according to the control signal P1. The analog switches SW22 and SW25 are controlled according to the control signal P2. The analog switch SW25 is controlled according to the control signal P1D.

Analog switches SW23, SW24 and SW25 correspond respectively to analog switches SW11, SW12 and SW13 in the analog switch circuit of FIG. 5. Control signals P1, P1D and P2 supplied to analog switches SW23, SW24 and SW25 each have timing described in FIG. 6.

In the sample-and-hold circuit of FIG. 9, the voltage Vsw supplied to the other terminal of the analog switch SW25 should be set to a voltage satisfying the requirement given below. The voltage Vsw is set so that off leakage current Ioff of the analog switch SW23 becomes a constant value, and the voltage Vsw is set to the different voltage of the input voltage of the analog switch circuit, that is, a voltage of the inverting input terminal (−) of the operational amplifier 15. The voltage of the inverting input terminal (−) of the operational amplifier 15 is equal to a voltage VP of non-inverting input terminal (+), and is constant. The transistor forming the analog switch SW23 receives no influence caused by the body effect. Therefore, the voltage Vsw may be set to a constant value. Therefore, it is sufficient for the voltage Vsw to be constant and different from the voltage VP. For example, the voltage Vsw may be the ground voltage VSS or the power supply voltage VDD.

The analog switch SW24 is supplied with the control signal P1D delaying a fall of the control signal P1. Thus, when the analog switch SW24 changes from on-state to off-state, the capacitor C1 is uninfluenced by clock feed-through.

In the sample-and-hold circuit shown in FIG. 9, two analog switches, SW23 and SW24, are connected in series between the output terminal of the operational amplifier 15 and the inverting input terminal (−) thereof. For this reason, the on resistance Ron between the foregoing terminals becomes large. However, the analog switch SW24 that corresponding to the analog switch SW12 of FIG. 5 imposes on the capacitor C1 no influence due to clock feed-through. Thus, the device dimensions of any transistor provided in the analog switch SW24 are large enough to reduce the on resistance Ron. This prevents an increase in the on resistance Ron resulting from the analog switch SW24.

As seen from the foregoing sample-and-hold circuit of FIG. 9, the analog switch circuit of FIG. 5 is used, and thereby, the off leakage current Ioff in a switch transistor is kept at a constant value. Usually, the sample-and-hold circuit is operated synchronously with a clock signal having a predetermined frequency. Therefore, the hold time, that is, a period when the control signal P2 is at an "H" level, is constant. Namely, the value of off leakage current Ioff is constant, and the hold time is also constant; therefore, an error of the hold voltage becomes a constant value. In other words, offset merely occurs in the hold voltage, and no distortion occurs therein.

Incidentally, the analog switch circuit of FIG. 5 is applicable to various other circuits in addition to the sample-and-hold circuit shown in FIG. 9. In FIG. 10 to FIG. 14, there are shown various circuits to which the analog switch circuit of FIG. 5 is applied. These circuits can obtain the same effect as the sample-and-hold circuit shown in FIG. 9.

Figure 10:
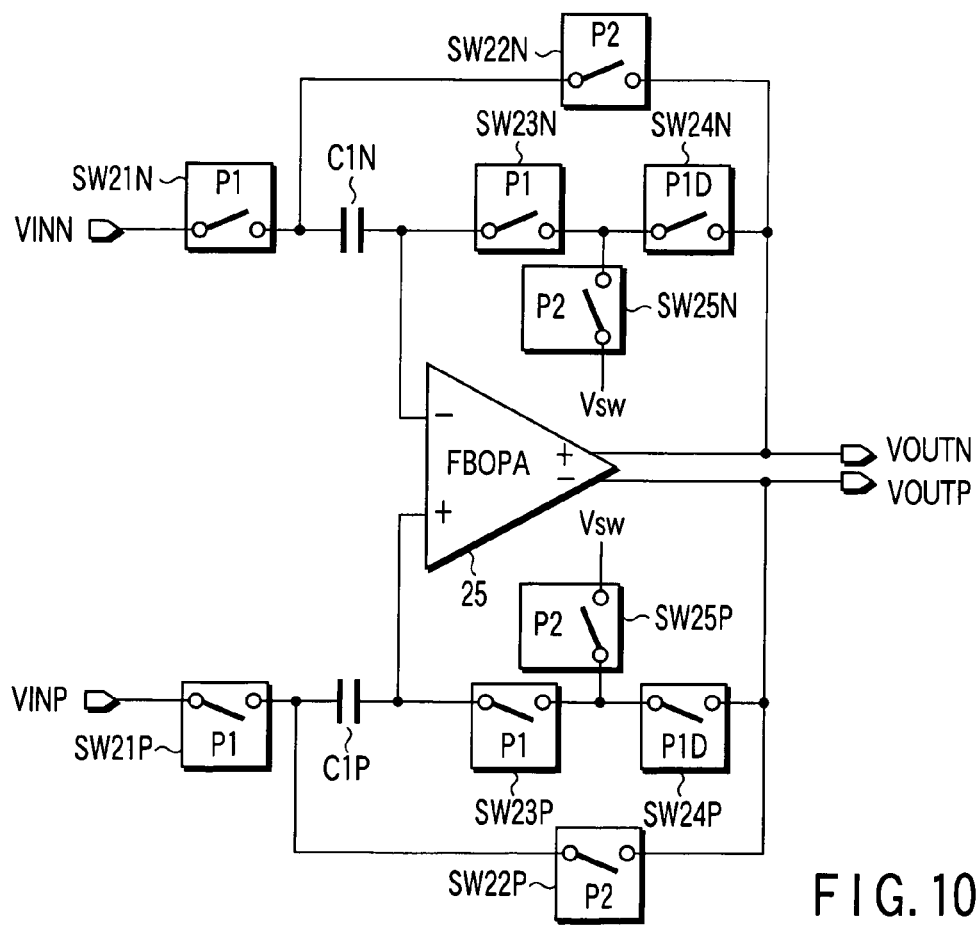
FIG. 10 is a circuit diagram showing a second example of the sample-and-hold circuit using the analog switch circuit of FIG. 5.

More specifically, FIG. 10 shows the configuration of a sample-and-hold circuit performing the same function as the sample-and-hold circuit shown in FIG. 9 using a fully differential circuit. In FIG. 10, VINN and VINP denote a differential input voltage, and VOUTN and VOUTP denote a differential output voltage.

Components included in the sample-and-hold circuit of FIG. 10 correspond to those included in the sample-and-hold circuit shown in FIG. 9 in their function. A reference numeral 25 denotes a fully differential operational amplifier (FBOPA), and corresponds to the operational amplifier 15 shown in FIG. 9. Capacitors C1N and C1P correspond to the capacitor C1 shown in FIG. 9. Analog switches SW21N and SW21P correspond to the analog switch SW21 shown in FIG. 9. Analog switches SW22N and SW22P correspond to the analog switch SW22 shown in FIG. 9. Analog switches SW23N and SW23P, SW24N and SW24P, SW25N and SW25P correspond to the analog switches SW23, SW24 and SW25 shown in FIG. 9, respectively.

The operation of the sample-and-hold circuit of FIG. 10 is similar to the sample-and-hold circuit of FIG. 9 except that input and output signals are each a differential signal.

Figure 11:
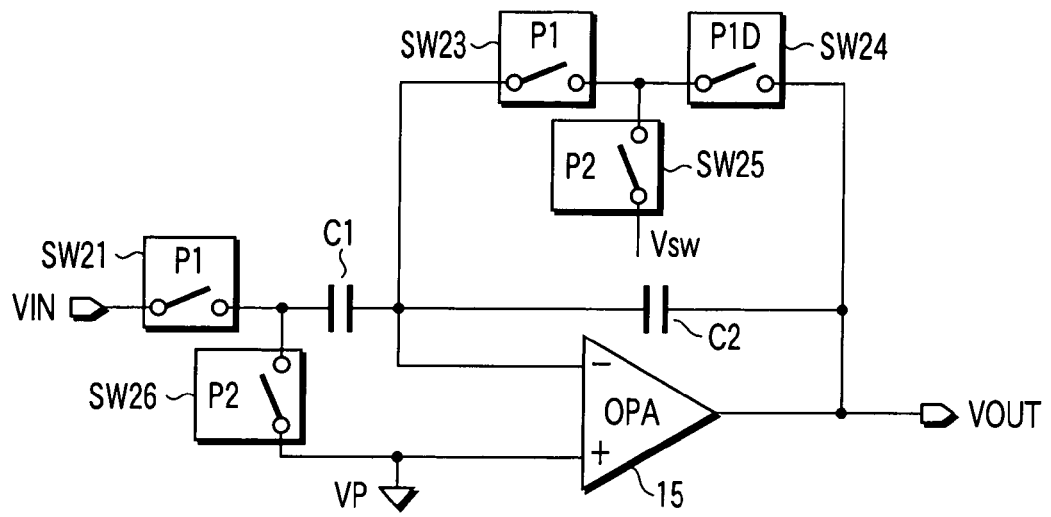
FIG. 11 is a circuit diagram showing a third example of the sample-and-hold circuit using the analog switch circuit of FIG. 5.

FIG. 11 shows the configuration of another sample-and-hold circuit using the analog switch circuit of FIG. 5. The sample-and-hold circuit of FIG. 11 includes analog switches SW21, SW23, SW24, SW25, SW26, operational amplifier 15 and capacitor C1. The analog switch SW26 is inserted between a serial connection node of the analog switch SW21 and the capacitor C1 and a constant voltage node VP. In FIG. 11, VIN denotes an input voltage of an input node, and VOUT denotes an output voltage of an output node. Analog switches SW21 and SW23 are controlled according to a control signal P1. The analog switch SW24 is controlled according to a control signal P1D. Analog switches SW25 and SW26 are controlled according to a control signal P2.

The sample-and-hold circuit of FIG. 11 is configured using the analog switch circuit of FIG. 5 including analog switches SW23 to SW25. Therefore, the sample-and-hold circuit of FIG. 11 can obtain the same effect as described in the sample-and-hold circuit of FIG. 9.

Figure 12:
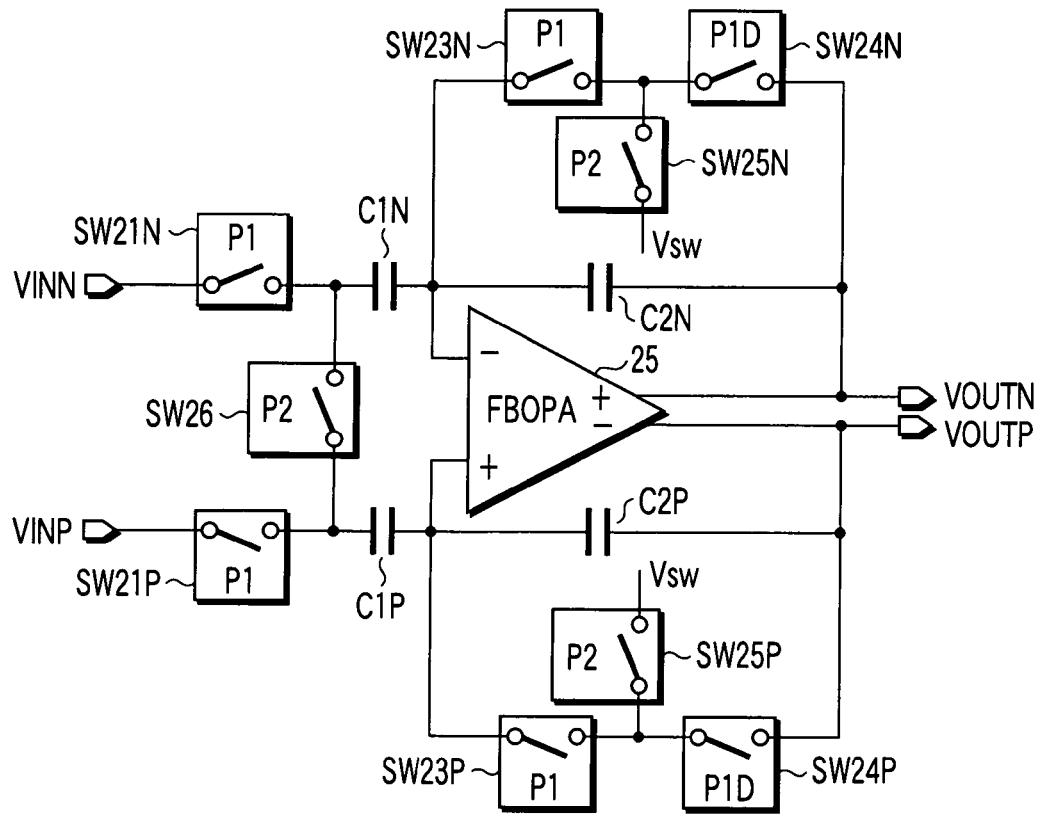
FIG. 12 is a circuit diagram showing a fourth example of a sample-and-hold circuit using the analog switch circuit of FIG. 5.

FIG. 12 shows the configuration of a sample-and-hold circuit performing the same function as the sample-and-hold circuit shown in FIG. 11 using a fully differential circuit. In FIG. 12, VINN and VINP denote a differential input voltage, and VOUTN and VOUTP denote a differential output voltage.

Components included in the sample-and-hold circuit of FIG. 12 correspond to those included in the sample-and-hold circuit shown in FIG. 11 in their function. A reference numeral 25 denotes a fully differential operational amplifier (FBOPA), and corresponds to the operational amplifier 15 shown in FIG. 11. Capacitors C1N and C1P correspond to the capacitor C1 shown in FIG. 11, and capacitors C2N and C2P correspond to the capacitor C2 shown in FIG. 11. Analog switches SW21N and SW21P correspond to the analog switch SW21 shown in FIG. 11. Analog switches SW23N and SW23P, SW24N and SW24P, SW25N and SW25P correspond to the analog switches SW23, SW24 and SW25 shown in FIG. 11, respectively. The analog switch SW26 corresponds to the analog switch SW26 shown in FIG. 11.

The operation of the sample-and-hold circuit of FIG. 12 is similar to the sample-and-hold circuit of FIG. 11 except that input and output signals are each a differential signal.

Figure 13:
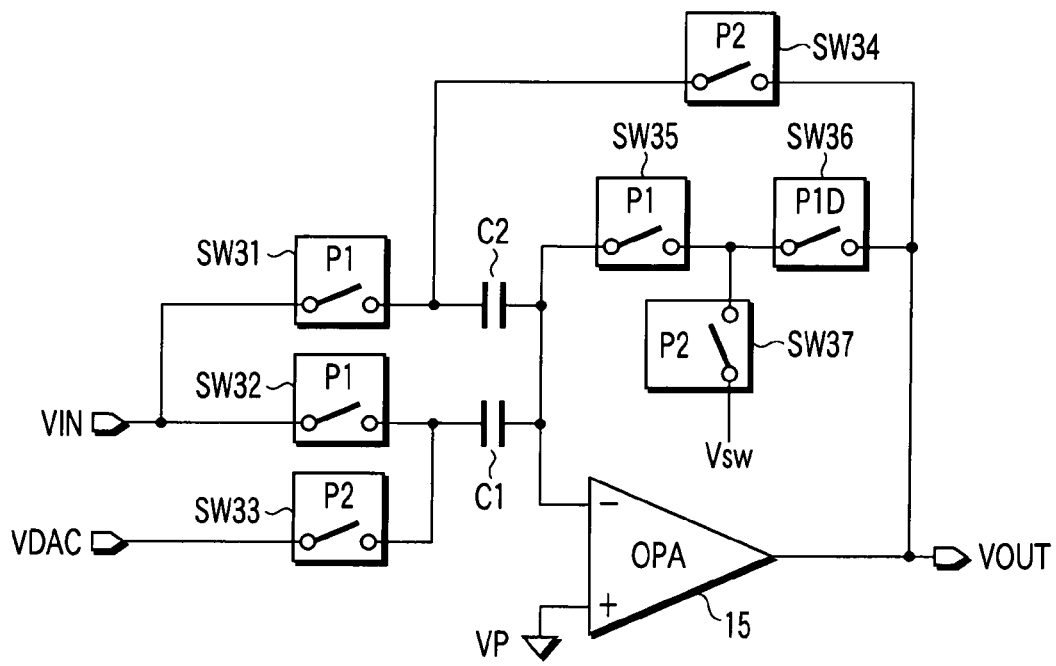
FIG. 13 is a circuit diagram showing a first example of a multiplying digital-to-analog converter using the analog switch circuit of FIG. 5.

FIG. 13 shows the configuration of a multiplying digital-to-analog converter (MDAC) for pipeline analog-to-digital converter (ADC) using the analog switch circuit of FIG. 5.

The MDAC of FIG. 13 includes analog switches SW31 to SW37, operational amplifier (OPA) 15, capacitors C1 and C2. In FIG. 13, VIN denotes an input voltage of an input node, and VOUT denotes an output voltage of an output node. VDAC denotes a reference voltage. Analog switches SW31, SW32 and SW35 are controlled according to a control signal P1. The analog switch SW36 is controlled according to a control signal P1D. Analog switches SW33, SW34 and SW37 are controlled according to a control signal P2.

The operation of the MDAC shown in FIG. 13 differs from the sample-and-hold circuits shown in FIG. 9 and FIG.

11. In this case, the analog switches SW35 and SW36 are connected in series between the inverting input terminal (−) of the operational amplifier 15 and the output terminal thereof. For this reason, when charges of the capacitor C1 or C2 leak due to the off leakage current Ioff of the analog switch SW35, an error occurs in a hold voltage. However, the analog switch circuit of FIG. 5 using analog switches SW35, SW36 and SW37 is used in the MDAC. Therefore, the same effect as described in the sample-and-hold circuits shown in FIG. 9 and FIG. 11 is obtained.

Figure 14:
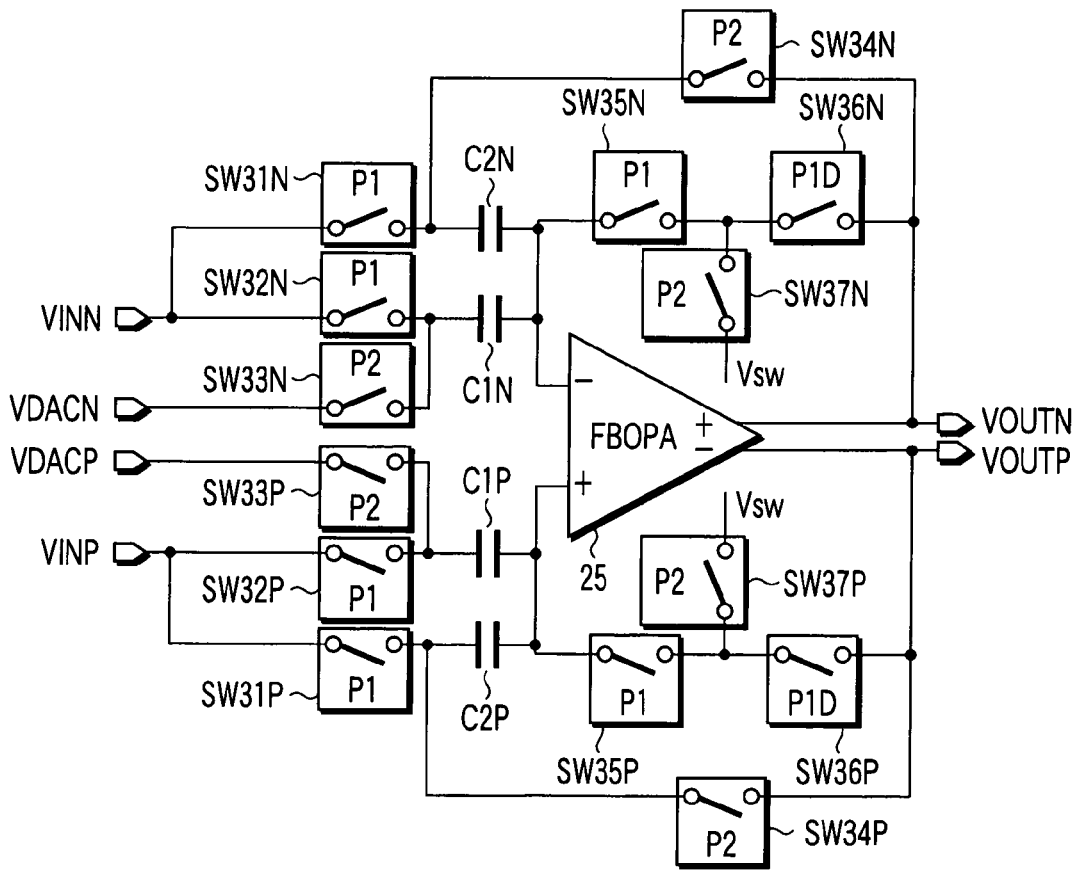
FIG. 14 is a circuit diagram showing a second example of the multiplying digital-to-analog converter using the analog switch circuit of FIG. 5.

FIG. 14 shows the configuration of an MDAC performing the same function as the MDAC shown in FIG. 13 using a fully differential circuit. In FIG. 14, VINN and VINP denote a differential input voltage, and VOUTN and VOUTP denote a differential output voltage. VDACN and VDACP denote a differential reference voltage. Components included in the MDAC of FIG. 14 correspond to those included in the MDAC shown in FIG. 13 in their function. A fully differential operational amplifier (FBOPA) 25 corresponds to the operational amplifier 15 shown in FIG. 13. Capacitors C1N and C1P correspond to the capacitor C1 shown in FIG. 13, and capacitors C2N and C2P correspond to the capacitor C2 shown in FIG. 13. Analog switches SW31N and SW31P correspond to the analog switch SW31 shown in FIG. 13. Analog switches SW32N and SW32P, SW33N and SW33P, SW34N and SW34P, SW35N and SW35P correspond to the analog switches SW32, SW33, SW34 and SW35 shown in FIG. 13, respectively. The analog switches SW36N and SW36P correspond to the analog switch SW36 shown in FIG. 13, and the analog switches SW37N and SW37P correspond to the analog switch SW37 shown in FIG. 13.

The operation of the MDAC shown in FIG. 14 is similar to the MDAC of FIG. 13 except that input and output signals are each a differential signal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An analog switch circuit comprising:
   a first node supplied with a first voltage;
   a second node;
   a first analog switch having one terminal connected directly to the first node and another terminal connectedly directly to a third node, and being controlled in on/off state;
   second analog switch having one terminal connected directly to the third node, and being controlled in on/off-state; and
   a voltage supply circuit connected to the third node, and which supplies a second voltage different from the first voltage to the third node when both of the first and second analog switches are in off-state;
   wherein the voltage supply circuit supplies the second voltage to the third node, a potential difference between the first and second voltages coincides with a value in which a voltage corresponding to variations of a threshold voltage by body effect of the first analog switch is added to a predetermined potential difference.

2. The circuit according to claim 1, wherein the voltage supply circuit includes a third analog switch, which has one terminal connected to the third node and the other terminal receiving the second voltage, and is controlled in on-state when both of the first and second analog switches are in off-state.

3. The circuit according to claim 2, wherein the first, second and third analog switches each include a MOS transistor.

4. The circuit according to claim 1, wherein the second analog switch is controlled that it changes from on-state to off-state after a delay of timing when the first analog switch changes from on-state to off-state.

5. The circuit according to claim 2, further comprising:
   a voltage generator circuit configured to generate the second voltage, and supplied it to the other terminal of the third analog switch.

6. The circuit according to claim 5, wherein the voltage generator circuit includes:
   a current source having one terminal connected to a first power supply node and the other terminal connected to the other terminal of the third analog switch; and
   a transistor having a source-drain current path and a gate electrode, the current path being interposed between a second power supply node and the other terminal of the third analog switch, the gate electrode being connected to the first node.

7. The circuit according to claim 6, wherein the first power supply node is a node supplied with a ground voltage, the second power supply node is a node supplied with a positive power supply voltage, and the transistor is an NMOS transistor.

8. The circuit according to claim 6, wherein the first power supply node is a node supplied with a positive power supply voltage, the second power supply node is a node supplied with a ground voltage, and the transistor is a PMOS transistor.

9. A sample-and-hold circuit comprising:
   a first node supplied with an input voltage;
   an operational amplifier having an input terminal and an output terminal;
   a first analog switch connected between the first node and a second node;
   a capacitor connected between the second node and the input terminal of the operational amplifier;
   a second analog switch connected between the output terminal of the operational amplifier and the second node;
   a third analog switch having one terminal connected directly to the input terminal of the operational amplifier and another terminal connected directly to a third node, and being controlled in on/off state;
   a fourth analog switch having one terminal connected directly to the third node and another terminal connected directly to the output terminal of the operational amplifier, and being controlled in on/off-state; and
   a voltage supply circuit connected to the third node, and which supplies a second voltage different from a first voltage of the input terminal of the operational amplifier to the third node when both of the third and fourth analog switches are in off-state.

10. The circuit according to claim 9, wherein the voltage supply circuit includes a fifth analog switch, which has one terminal connected to the third node and the other terminal receiving the second voltage, and is controlled in on-state when both of the third and fourth analog switches are in off-state.

11. The circuit according to claim 10, wherein the first to fifth analog switches each includes a MOS transistor.

12. The circuit according to claim 9, wherein the second voltage is constant.

13. The circuit according to claim 9, wherein the fourth analog switch is controlled that it changes from on-state to off-state after a delay of timing when the third analog switch changes from on-state to off-state.

14. A sample-and-hold circuit comprising:
a first node supplied with an input voltage;
an operational amplifier having an output terminal, first and second input terminals;
a first analog switch connected between the first node and a second node;
a first capacitor connected between the second node and the first input terminal of the operational amplifier;
a second capacitor connected between the first input terminal of the operational amplifier and the output terminal thereof;
a second analog switch connected between the second node and a constant voltage node;
a third analog switch having one terminal connected directly to the first input terminal of the operational amplifier and another terminal connected directly to a third node, and being controlled in an on/oft state;
a fourth analog switch having one terminal connected directly to the third node and another terminalconnected directly to the output terminal of the operational amplifier, and being controlled in an on/off state; and
a voltage supply circuit connected to the third node which is a series connection node of the third and fourth analog switches, and supplies a second voltage different from a first voltage of the first input terminal of the operational amplifier to the third node when both of the third and fourth analog switches are in off-state.

15. The circuit according to claim 14, wherein the voltage supply circuit includes a fifth analog switch, which has one terminal connected to the third node and the other terminal receiving the second voltage, and is controlled in on-state when both of the third and fourth analog switches are in off-state.

16. The circuit according to claim 14, wherein the fourth analog switch is controlled that it changes from on-state to off-state after a delay of timing when the third analog switch changes from on-state to off-state.

17. The circuit according to claim 14, wherein the first input terminal of the operational amplifier is an inverting input terminal, and the second input terminal of the operational amplifier is a non-inverting input terminal.

18. The circuit according to claim 17, wherein the non-inverting input terminal of the operational amplifier is fixed to a constant voltage.

19. The circuit according to claim 14, wherein the second voltage is constant.

* * * * *